March 24, 1970 O. J. OTT ET AL 3,502,994

ELECTRICALLY VARIABLE DELAY LINE

Filed Nov. 2, 1966 2 Sheets-Sheet 1

INVENTORS
OWEN J. OTT
RAYMOND A. RUNYAN
BY
Kenyon & Kenyon
ATTORNEYS

March 24, 1970 O. J. OTT ET AL 3,502,994

ELECTRICALLY VARIABLE DELAY LINE

Filed Nov. 2, 1966 2 Sheets-Sheet 2

INVENTORS
OWEN J. OTT
RAYMOND A. RUNYAN
BY Kenyon & Kenyon
ATTORNEYS

3,502,994
ELECTRICALLY VARIABLE DELAY LINE

Owen J. Ott, Brookfield, and Raymond A. Runyan, Ridgefield, Conn., assignors to Data Control Systems, Inc., Danbury, Conn., a corporation of Delaware Filed Nov. 2, 1966, Ser. No. 591,500
Int. Cl. H03k *5/18*
U.S. Cl. 328—155 6 Claims

ABSTRACT OF THE DISCLOSURE

An electrically variable time delay circuit in which precise time delay is provided in accordance with an adjustable control signal. Increments of coarse delay are provided by a multisection delay line selectively and sequentially gated by a first control signal, and fine delay provided by a single fixed delay line operative with sequentially activated gates such that the fine delay is proportional to the duty cycle of a second control signal.

This invention relates to an electrically variable delay line wherein the amount of time delay imposed upon an input signal can be selectively varied and is continuously electrically controlled.

In the past, the function of electrically controlling a variable delay line was usually accomplished through the use of a variable inductance or a variable capacitance in the delay line. By varying the electrical potential applied to the inductance or capacitance the amount of delay imposed upon the input signal in the delay line could be increased or decreased as desired. The disadvantage of this technique, however, was that the increment of delay which could be imposed on the input signal as a practical matter was relatively a small fraction of the total delay available in the delay line—a line which had a nominal delay of 100 microseconds might only be variable $\pm 20$ microseconds in order to maintain linearity in response. These limitations are known to those skilled in the art. A further disadvantage resulting from the use of these techniques was that by varying the inductance or capacitance in the delay circuit, the characteristic impedance of the entire line through which the input signal travelled is changed with the result that it becomes difficult to obtain a final signal with the proper wave form characteristics. That is, by varying the amount of delay selected, the variation in characteristic impedance results in a mistermination of the line, thereby changing the wave form of the output signal when a complex signal wave is propagated through the line. Methods to automatically reterminate the line as the characteristic impedance is varied are complex and expensive. The previous method also suffers from a tendency to couple the control signal into the output signal, thereby corrupting its wave form as the delay is varied.

Other earlier techniques utilized mechanical means for varying the amount of delay in a delay line. The disadvantage of these devices was the absence of a means for continuously controlling the variable feature of the delay line. Additionally the use of a manual control rather than an electrical control was a severe limitation on the efficiency of these devices.

Therefore the principal object of this invention is to provide a means of continuous electrical control over a variable delay line in a way which effectively eliminates any adverse effect on the input signal caused by selecting varying amounts of desired delay in the electrical delay line. That is, this invention provides a means of effectively decoupling the time delay command signal from the input signal being delayed.

Secondly, it is the object of this invention to permit precise selection of any amount of time delay from zero to the full value of the time delay available in a vernier or fine delay line; and, in conjunction with a coarse delay circuit, to permit precise selection of any amount of time delay from zero to the full value of the time delay available in the coarse delay circuit.

Third, it is the object of this invention to permit the use of time delays in a wide range of band widths limited only by the switching speed of the time delay command circuits.

The present invention comprises an electrically variable delay line which broadly includes two sections, namely, a fine delay section and a coarse delay section.

The fine delay section has a fine delay line coupled to two gates A and B which operate alternatively and sequentially so that together they perform an averaging function. That is, when gate A is energized, the signal to be delayed by the system completely by-passes the fine delay line and is not delayed at all; and, when gate B is energized, the signal to be delayed by the system must pass through the fine delay line and is thereby delayed by the full amount of the delay available in the fine delay line. Since the outputs of both gates are connected to a common point, it is therefore possible to select any desired incremental amount of delay from 0 to the full value of the fine delay line, by variably controlling the relative amounts of predetermined time intervals that gates A and B are conducting, thereby averaging the amount of delay imposed upon the input signal. Furthermore, by causing gates A and B to continuously and repeatedly perform their alternative and sequential operation of conducting and not conducting for predetermined time intervals (at a rate which can be appropriately described as the switching frequency), the input signal can be continuously delayed without further assistance. An oscillator is used to provide the continuous electrical control signal which alternatively and sequentially energizes gates A and B, and a duty cycle modulator provides the variable control for selecting the relative amounts of predetermined time intervals during which gates A and B are energized.

By using a coarse delay section, which comprises a series of delay lines and plurality of gates, in combination with the fine delay section, it is possible to obtain selective amounts of delay from zero to the full length of the combined fine and coarse delay lines.

Other and incidental objects of the present invention will be apparent to those skilled in the art from a reading of this specification and an inspection of the accompanying drawings which are briefly described below:

Figure 1:
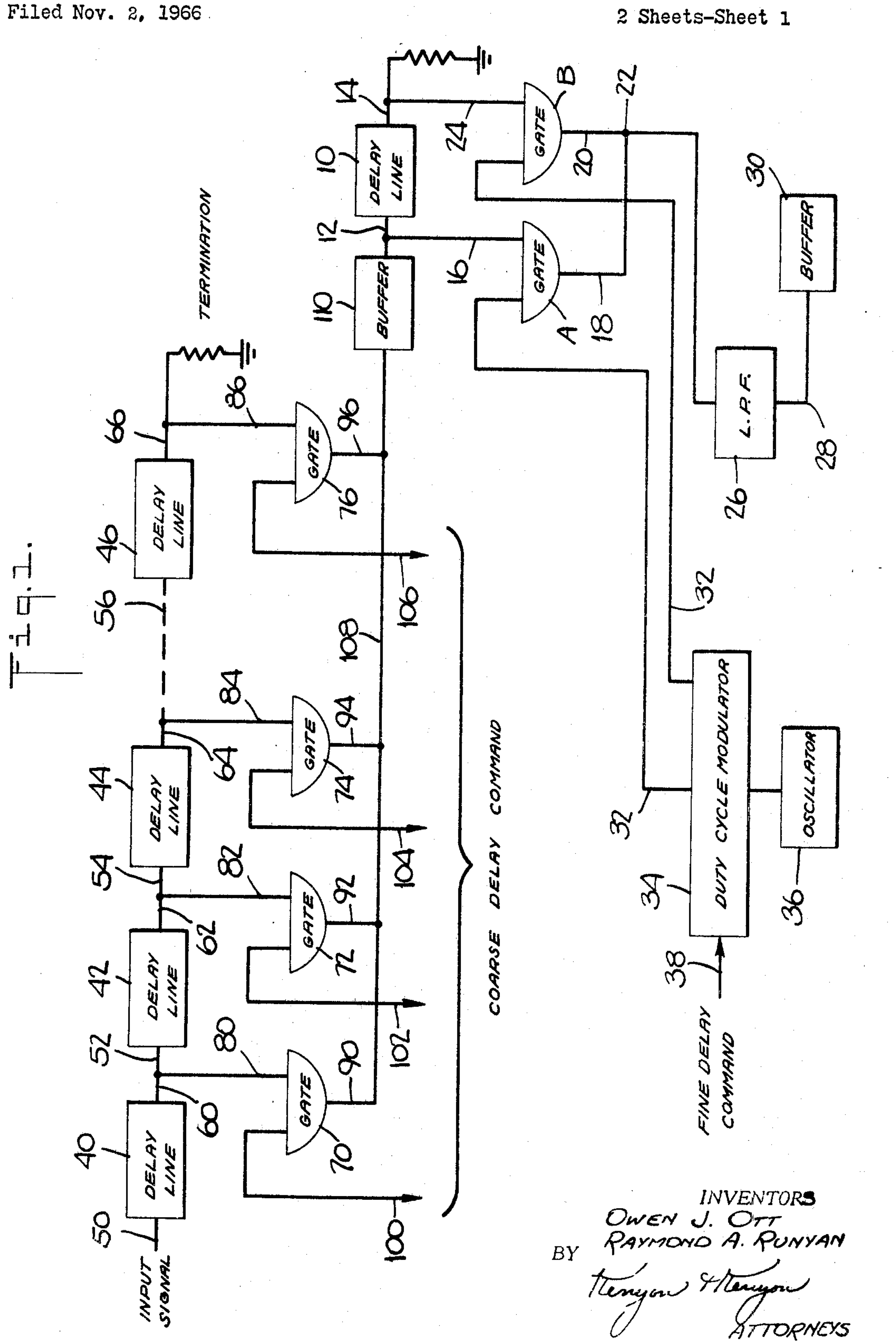
FIGURE 1 is a complete electrical diagram of the present invention showing the combination of a fine delay section and a coarse delay section.

What follows below is a description of our invention:

Essentially the embodiment of this invention illustrated in FIGURE 1 can be broken down into two large sections. The first section can be described as the fine delay section and the second section can be described as the coarse delay section. The two sections will be described in that order.

(I) Fine Delay Section

The fine delay section has a fine delay line 10 which is in itself a standard electrical circuit common in the prior art and capable of delaying an electrical signal a predetermined time interval. Therefore, the fine delay line 10 will not be further described in detail and will be presumed to have a time delay of $t$ microseconds. The delay line 10 has an input side 12 and an output side 14. Gate A is a switching device which is common in the prior art and is capable of being turned on and off so as to permit an electrical signal to pass through the gate or not, respectively. The input side 16 of gate A is connected to the input side of 12 of the delay line 10 and the output side 18 of gate A is connected to the output side 20 of gate B at the common point 22. Gate B is similar in construction to gate A and will not be described in further detail. Gate B has its input side 24 connected to the output side 14 of the delay line 10 and has its output side 20 connected to the output side 18 of gate A as described above. Of course whenever gate B is turned on, the input signal coming into gate B has already been delayed by the full amount of the delay line 10, $t$ microseconds. The common point 22 to which the outputs 18, 20 of gates A and B are connected is also the input side of an ordinary low pass filter 26, of a type that is common in the prior art, through which the signals coming from gates A and B are allowed to pass. This filter 26 passes input signal frequency components but rejects components lying in the vicinity of the switching frequency. The output side 28 of the low pass filter 26 is connected in series to an ordinary buffer circuit 30 of a type that is common in the prior art. Gate A is connected to the output 32 of the duty cycle modulator 34 so that gate A is energized by the "on" portion of the modulator's output signal. Gate B is connected to the same output 32 of the duty cycle modulator 34 so that gate B is energized by the "off" portion of the modulator's output signal. The portions of the modulator's output signal which energize gates A and B also respectively deenergize gates B and A so that gates A and B operate alternatively and sequentially. The duty cycle modulator 34 continuously receives its signal pulse from an ordinary oscillator circuit 36. Both of these components 34 and 36 are electrical circuits common in the prior art and will not be described in further detail. The duty cycle modulator 34 is provided with a means 38 for varying the duty cycle as indicated by the arrow labeled "Fine Delay Command" in FIGURE 1. The means for varying the duty cycle can be either mechanically or electrically operated by a human operator.

Having thus defined the entire circuitry of the fine delay circuit, the operation of the fine delay circuit is as follows:

The oscillator 36, operating at a certain predetermined frequency (the switching frequency), has an output which is a continuous electrical signal of the ordinary sine wave type. This signal is modulated by the duty cycle modulator 34 into the desired wave form having an "on" portion and an "off" portion of predetermined duration as selected by the fine delay command 38. That is to say, through the fine delay command 38 the operator can vary the duty cycle of the duty cycle modulator 34 and thereby obtain from the duty cycle modulator 34 an output signal whose "on" portion constitutes a predetermined time interval of the total duty cycle and whose "off" portion constitutes a predetermined time interval representing the balance of the total duty cycle. The relative amounts of "on" portion and "off" portion obtainable through variations of the fine delay command 38 include all amounts from a signal which is made up entirely of an "on" portion with no "off" portion at all, to a signal which is made up entirely of an "off" portion with no "on" portion at all, as well as all variations between these two extremes. The frequency of the output signals of the duty cycle modulator 34 (the switching frequency) is the same as the frequency of the output signal generated by the oscillator 36. In this manner the oscillator 36 and duty cycle modulator 34 provide a continuous output signal which is available to electrically control the operation of the delay line.

The output signal from the duty cycle modulator 34 is then fed by line 32 to both gates, gate A and gate B. These gates continuously operate alternatively and sequentially. More specifically, gate A is operated by the "on" portion of the duty cycle modulator output signal and gate B is operated by the "off" portion of the duty cycle modulator output signal. (This designation is arbitrarily selected for simplicity of description, it being understood that gate A could be operated by the "off" portion and gate B could be operated by the "on" portion.) Thus, through one cycle of the signal coming out of the duty cycle modulator 34, gate A will be turned on only during that predetermined time interval for which there is an "on" portion of the modulator output signal. Gate B will be turned on only during that predetermined time interval for which there is an "off" portion of the modulator output signal. Since the "on" portion of the duty cycle signal is followed immediately by the "off" portion of said signal and since A and B gates are turned on only during one or the other portions, as described above, therefore, gates A and B will be automatically operated sequentially and alternatively as directed by the duty cycle signal. The portion which energizes one gate simultaneously deenergizes the other gate. This operation will be continuously repeated through each subsequent cycle of the duty cycle signal without further interference or assistance by a human operator. Of course a change in the fine delay command 38 will change the duty cycle and the relative amounts of "on" and "off" portions of the duty cycle signal, and, hence, will change the relative amounts of time that either A or B gate will be in operation.

When gate A is energized, the portion of the input signal at the input side 12 of the delay line 10 will pass through the open gate A and, therefore, will not be delayed at all since that portion has completely by-passed the delay line 10. When gate A is turned off by the duty cycle signal, gate B is energized immediately and the portion of the input signal arriving at the input side 12 of the delay line 10 must then pass through the delay line 10 itself and then through gate B to provide a delayed signal. Of course, any time gate B is turned on, the portion of the input signal that passes through the delay line 10 is delayed the full amount of the delay line 10, $t$ microseconds. Of course, the outputs 18 and 20 of gates A and B are both connected to a common point 22, and, therefore, the signal which passes through the common point 22, to the low pass filter 26 (hereinafter referred to as the sum signal) has a wave shape made up of underlayed portions—those which have come from gate A—and delayed portions—those which have come from gate B. Thus, this sum signal is a signal that is delayed in comparison to the input signal as it originally was when it arrived at the input side 12 of the delay line 10. The amount of delay in this sum signal which is then sent to the low pass filter 26 is a function of the duty cycle as described below. The sum signal obtained from the output sides 18 and 20 of gates A and B is then put through an ordinary low pass filter circuit 26 and an ordinary buffer circuit 30 which attenuate undesired switching frequency components in the combined A and B outputs and put the sum signal in its final form.

These latter two circuits 26 and 30 are common in the prior art and will not be described in further detail.

Figure 2:
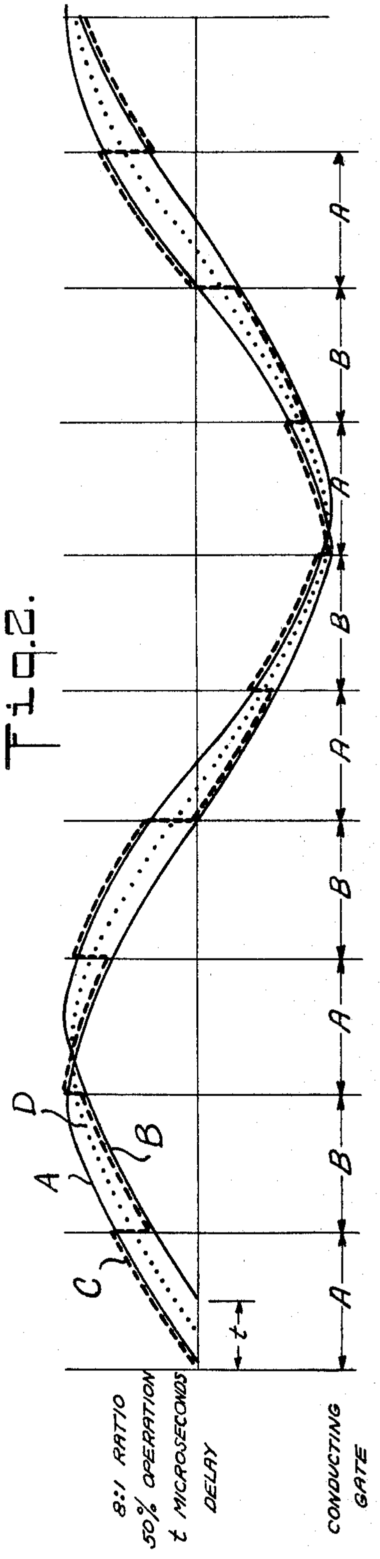
FIGURE 2 is a series of curves showing wave shape forms where the oscillator is operating at a frequency 8 times higher than the signal to be delayed and the duty cycle modulator is set at 50% operation.

The most important factor controlling the amount of delay imposed on the input signal is a function of the percentage of the total duty cycle during which gate B is energized and gate A is deenergized; that is, the predetermined time interval during which a signal is allowed to pass through the delay line 10 and gate B as a function of the total predetermined time interval for one cycle of the duty cycle modulator 34. For example, assuming that the output signal of the duty cycle modulator 34 has a specified frequency and that the fine delay command 38 is positioned so that the duty cycle modulator output signal consists entirely (100%) of an "on" portion and no (0%) "off" portion. In this condition, gate A will be energized during the entire cycle and during each subsequent cycle and gate B will be cut off. The input signal will pass through gate A and will not be delayed at all. At the other extreme, if the fine delay command 38 is positioned so that the duty cycle signal consists of no (0%) "on" portion and entirely (100%) an "off" portion, gate A will be turned off during the entire cycle and gate B will be energized during the entire cycle and each subsequent cycle. In this condition, the input signal will pass through the delay line 10 and gate B and will be delayed by the full amount of the delay line 10 which is *t* microseconds. Finally, if we take an example where the fine delay command 38 selects a duty cycle which consists of one-half (50%) "on" portion and one-half (50%) "off" portion, gates A and B will be energized for ½ cycle each and the same during each subsequent cycle. In this condition, the input signal during the time that gate A is in operation will not be delayed at all and during the time that gate B is in operation will be delayed by *t* microseconds, the full amount of the delay line 10; and, the sum signal which passes to the low pass filter 26 will consist of the combined outputs from gates A and B representing an average of the two signals which is 50% of the total delay available in the delay line 10, i.e., ½ *t* microseconds. Further examples could be cited wherein gate B is turned on 25% of the time or 75% of the time and the amount of delay imposed on the input signal would be respectively 25% and 75%. This operation is demonstrated in the set of curves labeled FIGURE 2 which define operating the circuit at a duty cycle modulator frequency eight times higher than the input signal frequency to be delayed and with gate B being turned on 50% of the time. Curve A indicates the input signal to gate A. Curve B indicates the input signal to gate B delayed by the full amount of the delay line 10, *t* microseconds. The dashed line, curve C, indicates the output signal at the common point 22 representing the sum of the signals coming out of gates A and B, and the dotted line D represents the final output signal after it is passed through the low pass filter 26, which eliminates the unwanted switching frequency components from the basic signal which, as indicated, is delayed by ½ *t* microseconds. When operating with gate B turned on 100% of the time, curve B would then represent the final output signal delayed by the full amount of the delay line 10, *t* microseconds; and, when operating with the A gate turned on 100% of the time, curve A would represent the final output signal without any delay imposed at all. Thus, it is readily apparent that the delay of the final output signal is directly proportional to the percentage of the total duty cycle during which gate B is turned on and is inversely proportional to the percentage of the duty cycle during which gate A is turned on. It is also clear from the set of curves in FIGURE 2 that the low pass filter 26 plays an important function in separating the undesired switching frequency components from the sum signal outputs of gates A and B. The low pass filter 26 is an ordinary filter circuit common in the art and quite capable of picking out the fundamental frequency contained in the sum signal arriving at its input side 22. Therefore, no detailed description is necessary for the low pass filter circuit. Similarly the buffer circuit 30 is common in the prior art to assist in coupling the final output signal to another circuit.

A second factor affecting the effectiveness and efficiency of the fine delay circuit is that the ratio of the duty cycle modulator output signal frequency (switching frequency) to the highest frequency of any input signal to be delayed by the system must be 5 to 1 or greater. If the switching frequency is not at least 5 times as great as the highest frequency in the input signal, then there is the problem that difference frequency signals will be generated which will be within the frequency band carrying information and will distort the information. It will be realized that the input signal is actually a carrier signal which is modulated so that information (intelligence) is superimposed thereon. A Fourier analysis of the sum signal coming from Gates A and B will show that the sum signal is a complex wave form containing not only the basic carrier frequency component of the input signal (and harmonics thereof) and the basic carrier frequency component of the input signal delayed by an amount equal to *t* microseconds (and harmonics thereof), but also, switching frequency components introduced by the sequential operation of the gating circuits. (Observe the wave, shape of curve C in FIGURE 2.) In addition, there will be sum and difference signals produced by the cross modulation of the switching signal and basic carrier signal. Where the switching frequency is, for example, only two times higher than the basic carrier frequency, the difference frequency will be a frequency within the band width of the modulated carrier signal. Since the difference frequency will therefore introduce signals into the band width carrying information, it is clear that such difference signals will give false intelligence readings in the ultimate output circuit. In addition, even where the difference signals are very close to, but outside of, the band width of the modulated carrier signal, expensive filtering would be required to insure that the difference frequency did not introduce false intelligence readings into the ultimate output circuit. It has been found as a practical matter that a switching frequency at least five times greater than the basic carrier frequency would be sufficient to assure the elimination of this problem.

Figure 3:
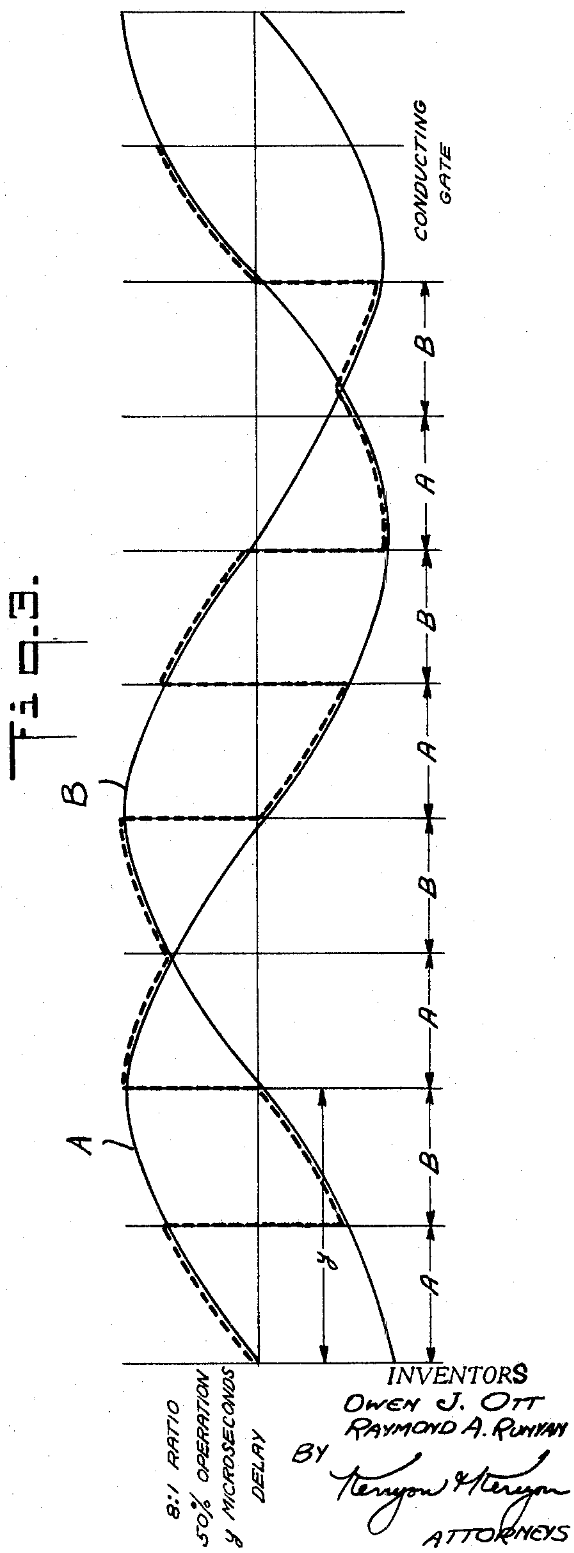
FIGURE 3 is a series of curves showing wave shape forms under the same conditions as shown in FIGURE 2 except that the total delay of the fine delay line is more than a radian of the frequency of the input signal.

The third factor affecting the effectiveness and efficiency of the fine delay circuit is the total value of the delay designed into delay line 10, compared to the highest frequency of the input signals to be delayed. It has been found that the fine delay circuit operates most effectively when the total value of the delay line 10 is less than a radian of the highest input signal frequency to be delayed by the system. Where the delay exceeds one radian, an amplitude loss is introduced into the basic frequency component of the sum signal. This condition is demonstrated in FIGURE 3 where it is clear that when the total value of the delay line 10 (shown as *y* in FIGURE 3) exceeds one radian of the frequency of the input signal (curve A of FIGURE 3) the amplitude of the basic frequency component of the sum signal (the sum signal itself is the composite signal coming out of gates A and B and shown by the dashed line labeled curve C in FIGURE 3) is greatly reduced as compared to the amplitude of the input signal. (The basic frequency component of the sum signal would be determined by a Fourier analysis and is not shown in FIGURE 3.)

More specifically, it might be easier to see why the above statement is true by referring to an even more extreme situation. If the delay line 10 has a delay of 180° of the input signal frequency and the duty cycle is 50%, no component of the intelligence will be present at the output. Thus, if the delay line 10 imposed a 180° delay and 50% duty cycle is employed, the amplitude of the basic frequency component in the output signal would be virtually zero. As the total delay designed into the delay line 10 is decreased, the amplitude of the basic frequency component of the sum signal increases (assuming a constant input signal frequency). Experience has shown that where the total delay in the delay line 10 is less than one radian of the highest frequency of the input signal, the amount of amplitude decrease in the basic frequency component of the sum signal is sufficiently slight to cause no serious concern.

Obviously, there are situations where an appreciable loss in the amplitude of the basic frequency component of the sum signal is of no concern, and in such cases this invention can be employed with a delay that is larger than one radian of the input signal frequency. The major point to keep in mind is that the amount of fixed delay designed into the delay line 10 can have an appreciable effect on the amplitude of the basic frequency component of the sum signal.

It should be noted that this limitation of delay to one radian imposes only an upper frequency limitation on the system. Thus, if *t* microseconds is made very small, then a very wide range of frequencies can be handled by the system. Furthermore, it is readily apparent that by utilizing additional fine delay circuits with even smaller predetermined time delays built into the delay lines that an even wider range of frequencies can be accommodated in this circuit. These additional delay lines are not shown in the diagram for they are identical to the fine delay line 10 described above and can be readily incorporated in the above circuit by one skilled in the art.

(II) Coarse Delay Section

The coarse delay section comprises a series of delay lines 40, 42, 44, 46 each of which has an input side 50, 52, 54, 56 and an output side 60, 62, 64, 66 and a plurality of gating circuits 70, 72, 74, 76. The input side 80, 82, 84, 86 of each gate 70, 72, 74, 76 is connected to the output side 60, 62, 64, 66 of its respective delay line 40, 42, 44, 46; and the output sides 90, 92, 94, 96 of all the gates are connected to a common point 108. A buffer circuit 110 of a kind which is common in the prior art is connected between the common point 108 and the input side 12 of the associated fine delay line previously described above. The buffer circuit performs one of its standard functions; namely, it prevents the fine delay line, gates and associated circuits from loading the coarse delay lines. All the gates 70, 72, 74, 76 are connected by lines 100, 102, 104, 106 to a means labeled Coarse Delay Command in FIGURE 1 which can selectively energize the gates 70, 72, 74 and 76 and which can be of any kind common in the art and which forms no part of this invention.

Each delay line 40, 42, 44, 46 in the coarse relay section has a total time delay of a predetermined value, saiy *t* microseconds. Since the coarse delay lines 40, 42, 44, 46 are connected in series, any multiple of *t* microseconds can be obtained by energizing the appropriate gate through the coarse delay command so that the input signal to be delayed must pass through only the appropriate number of coarse delay lines, the remaining coarse delay lines being bypassed. When the signal has been delayed by the coarse delay section and then passes to the fine delay section, the fine delay line circuit permits precise selection of any incremental value of *t* microseconds. For example, assume that *t* equals 100 microseconds and it is desired to delay the input signal by 250 microseconds. By energizing gate 72 through the coarse delay command the input signal will pass through only the first two coarse delay lines 40, 42 and then will pass through gate 72 and then the buffer circuit 110. The coarse delay section will have thus delayed the input signal by 200 microseconds since each of the two coarse delay lines 40, 42 consists of a 100 microsecond delay. The input signal can be further delayed an additional 50 microseconds in the fine delay section by setting the fine delay command 38 to the position corresponding to 50% operation of the fine delay section thereby selecting a fine delay of ½ *t* microseconds, i.e., 50 microseconds. The final output signal will have been thus delayed by a total of 250 microseconds.

What is claimed is:

1. An electrically variable time delay circuit comprising:

a delay line of a predetermined delay time and having an input and an output;

means for applying an input signal to the input of said delay line;

first and second AND gates each having first and second inputs and an output, said first inputs being connected respectively to the input and output of said delay line, said outputs being connected together;

duty cycle control means having an output connected to the second inputs of said first and second gates;

means for applying a control signal to said duty cycle control means, said control means being operative to provide an output signal the duty cycle of which is variable in response to said control signal;

said first and second gates being operative in response to on and off portions of said duty cycle, respectively, such that said gates are selectively and sequentially energized during each duty cycle; and output means connected to the outputs of said first and second gates.

2. The circuit according to claim 1 wherein said predetermined delay time is less than a radian of the highest frequency of an input signal applied to said circuit.

3. The circuit according to claim 1 wherein the output signal of said duty cycle control means has a frequency at least five times the highest frequency of an input signal applied to said circuit.

4. The circuit according to claim 1 wherein said duty cycle control means includes an oscillator operating at a predetermined switching frequency and a duty cycle modulator for providing in response to signals from said oscillator an output signal at said switching frequency and having a duty cycle variable in response to said control signal.

5. The circuit according to claim 4 wherein said output means includes a low pass filter operative to minimize spurious switching frequency components.

6. An electrically variable time delay circuit comprising:

a course delay section including:

a plurality of serially connected delay lines each of predetermined delay time and each having an input and an output;

means for applying an input signal to the input of the first of said serially connected delay lines;

a plurality of AND gates each having first and second inputs and an output, the first input of each of said gates being connected to a respective output of said delay lines, the second input of each of said gates being selectively connected to a source of first control signals, the output of each of said gates being connected to a common output line; and a fine delay section including a fine delay line of predetermined delay time and having an input and an output;

means for connecting said common output line to the input of said fine delay line;

first and second AND gates each having first and second inputs and an output, said first inputs being connected respectively to the input and output of said delay line, said outputs being connected together;

duty cycle control means having an output connected to the second inputs of said first and second gates;

means for applying a control signal to said duty cycle control means, said control means being operative to provide an output signal the duty cycle of which is variable in response to said control signal;

said first and second gates being operative in response to on and off portions of said duty cycle, respectively, such that said gates are selectively and sequentially energized during each duty cycle; and output means connected to the outputs of said first and second gates.

References Cited

UNITED STATES PATENTS

| | | | |
|---|---|---|---|
| 2,850,628 | 9/1958 | Davidoff | 328—55 |
| 3,024,417 | 3/1962 | Secretan | 328—56 XR |
| 3,367,110 | 2/1968 | Leeson | 328—155 XR |
| 3,374,362 | 3/1968 | Miller | 307—243 XR |

DONALD D. FORRER, Primary Examiner

STANLEY T. KRAWCZEWICZ, Assistant Examiner

U.S. Cl. X.R.

307—243, 293, 295; 328—55, 97